(12) United States Patent
Nakano

(10) Patent No.: US 10,069,402 B2
(45) Date of Patent: Sep. 4, 2018

(54) POWER SUPPLY APPARATUS AND IMAGE FORMING APPARATUS

(71) Applicant: CANON KABUSHIKI KAISHA, Tokyo (JP)

(72) Inventor: Keisuke Nakano, Suntou-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/810,864

(22) Filed: Nov. 13, 2017

(65) Prior Publication Data

US 2018/0145583 A1    May 24, 2018

(30) Foreign Application Priority Data

Nov. 18, 2016 (JP) ................................ 2016-224656

(51) Int. Cl.
| | |
|---|---|
| *H02M 1/36* | (2007.01) |
| *H03K 5/1536* | (2006.01) |
| *G03G 15/00* | (2006.01) |
| *H02M 1/08* | (2006.01) |
| *H02M 3/335* | (2006.01) |

(52) U.S. Cl.
CPC .......... *H02M 1/36* (2013.01); *G03G 15/5004* (2013.01); *H02M 1/083* (2013.01); *H02M 3/33569* (2013.01); *H03K 5/1536* (2013.01)

(58) Field of Classification Search
CPC ...... G06F 1/32; G03G 15/80; G03G 15/5004; H02M 2001/007; H02M 2001/0032; H02M 1/36
See application file for complete search history.

(56) References Cited

U.S. PATENT DOCUMENTS

| | | | |
|---|---|---|---|
| 8,655,216 B2 | 2/2014 | Mori | |
| 9,318,964 B2 * | 4/2016 | Inukai | ............... H02M 3/33538 |
| 9,411,287 B2 * | 8/2016 | Nozaki | ................... G03G 15/80 |
| 2013/0322898 A1 * | 12/2013 | Koseki | ................... G03G 15/80 |
| | | | 399/37 |

FOREIGN PATENT DOCUMENTS

JP          5729990 B2       6/2015

OTHER PUBLICATIONS

U.S. Appl. No. 15/815,144, filed Nov. 16, 2017. Applicant: Junya Kobayashi, et al.

* cited by examiner

*Primary Examiner* — Gary L Laxton
(74) *Attorney, Agent, or Firm* — Fitzpatrick, Cella, Harper & Scinto

(57) ABSTRACT

The power supply apparatus includes a control unit configured to determine a stand-by time period from making a connection of a switch unit to subjecting a second voltage conversion unit to activation according to an input voltage of the alternating current power supply detected by a voltage detection unit.

19 Claims, 8 Drawing Sheets

POWER SUPPLY APPARATUS AND IMAGE FORMING APPARATUS

BACKGROUND OF THE INVENTION

Field of the Invention

The present invention relates to a power supply apparatus that receives an alternating current (AC) voltage from a commercial alternating current (AC) power supply to generate a predetermined direct current voltage, and an image forming apparatus including the power supply apparatus.

Description of the Related Art

There has been known a switching power supply apparatus configured to generate a direct current voltage from an AC voltage input from a commercial AC power supply and supply electric power to a control unit and a driving unit for motors and the like, in various electronic apparatuses. In the switching power supply apparatus, an AC voltage is input from a commercial AC power supply, and then a capacitor is charged via an activation start resistor, the capacitor being connected to a power source terminal of a power supply control IC for controlling the power supply apparatus. A charged voltage of the capacitor reaches an activation start voltage, and then the power supply control IC is activated, starting a switching action of a transformer. When the transformer is switched, a voltage generated in an auxiliary winding of the transformer is supplied to a power source terminal of the power supply control IC, allowing the power supply control IC to operate with stability. Japanese Patent No. 5729990 discloses a technique that avoids inability of activation start being brought to a halt in such a manner that, even when a voltage of a capacitor connected to a power source terminal drops, the voltage is prevented from falling below an operation stop voltage of a power supply control IC until an output voltage from an auxiliary winding of a transformer sufficiently increases in activation start of the power supply control IC.

The switching power supply apparatus having the configuration described above may be additionally provided with a boost converter such as a power-factor correction circuit, in a previous stage of the switching power supply apparatus. In such a case, however, the following problem occurs. The switching power supply apparatus having such a configuration needs to start operation of the power supply control IC only when an output voltage from the boost converter increases to a normal voltage range, and a voltage applied to the power source terminal of the power supply control IC sufficiently exceeds the activation start voltage of the power supply control IC. For that reason, in conventional practice, an operation start timing for the power supply control IC is set in conformity with a condition for a case where an input voltage from the commercial AC power supply is low that prolongs a time period necessary for the activation start of the switching power supply apparatus. As a result, the operation start timing for the switching power supply apparatus is uniformly set at a late timing irrespective of the input voltage from the commercial AC power supply.

SUMMARY OF THE INVENTION

One aspect of the present invention is a power supply apparatus that is capable of advancing an operation start timing for the power supply apparatus.

Another aspect of the present invention is a power supply apparatus including: a voltage detection unit configured to detect an input voltage input from an alternating current power supply; a first voltage conversion unit configured to convert the input voltage into a first voltage; a second voltage conversion unit that is connected to the first voltage conversion unit and configured to convert the first voltage output from the first voltage conversion unit into a second voltage different from the first voltage; a switch unit configured to connect the alternating current power supply to the first voltage conversion unit or disconnect the alternating current power supply from the first voltage conversion unit; and a control unit configured to control the switch unit and the second voltage conversion unit, wherein the control unit determines a stand-by time period from making a connection of the switch unit to subjecting the second voltage conversion unit to activation start so as to connect the alternating current power supply and the first voltage conversion unit according to the input voltage detected by the voltage detection unit.

Still another aspect of the present invention is an image forming apparatus including: an image forming unit configured to form an image on a recording material; and a power supply apparatus configured to supply electric power to the image forming unit, wherein the power supply apparatus includes: a voltage detection unit configured to detect an input voltage input from an alternating current power supply; a first voltage conversion unit configured to convert the input voltage into a first voltage; a second voltage conversion unit that is connected to the first voltage conversion unit and configured to convert the first voltage output from the first voltage conversion unit into a second voltage different from the first voltage; a switch unit configured to connect the alternating current power supply to the first voltage conversion unit or disconnect the alternating current power supply from the first voltage conversion unit; and a control unit configured to control the switch unit and the second voltage conversion unit, wherein the control unit determines a stand-by time period from making a connection of the switch unit to subjecting the second voltage conversion unit to activation start so as to connect the alternating current power supply and the first voltage conversion unit according to the input voltage detected by the voltage detection unit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

[Configuration of Switching Power Supply Apparatus]

Figure 1:
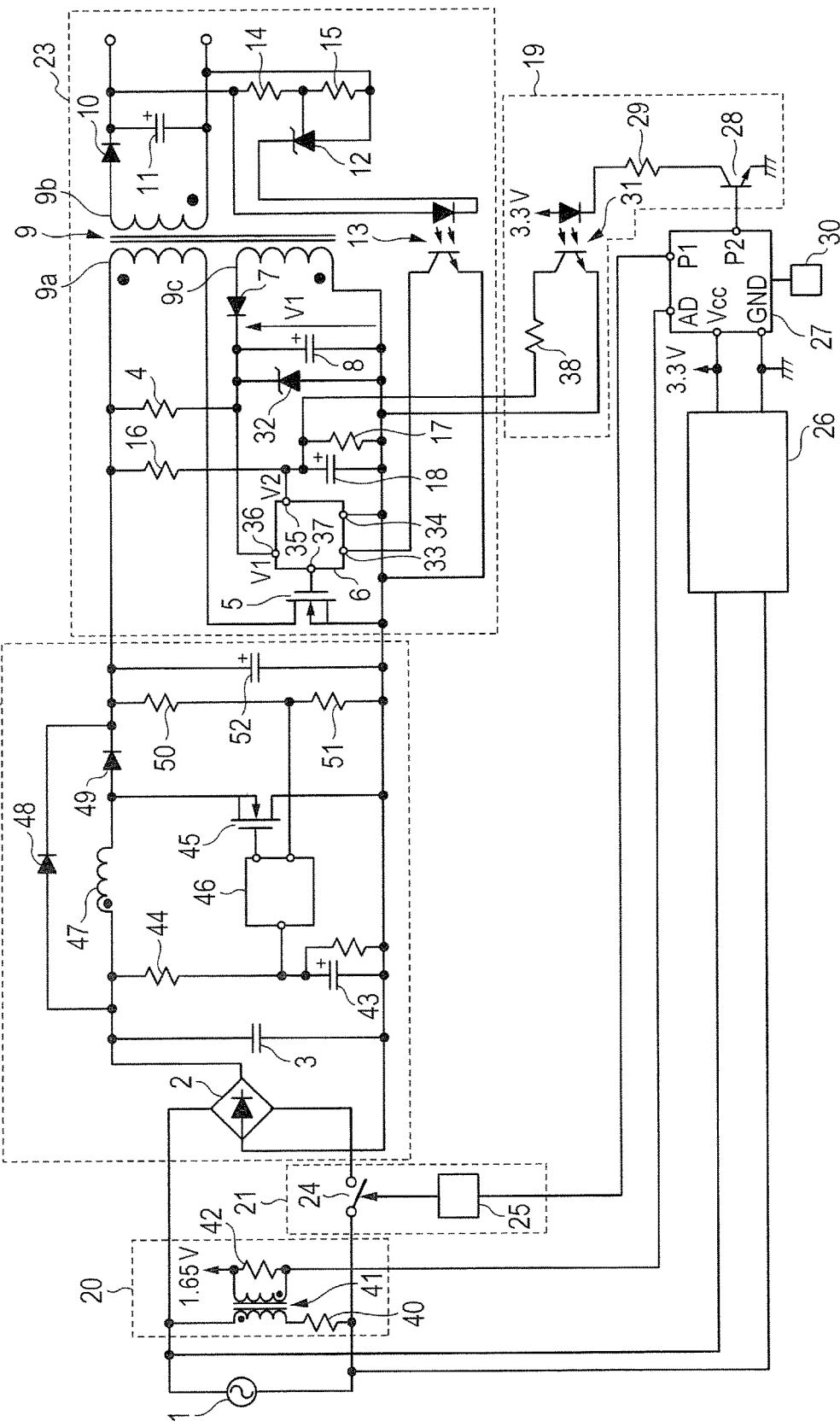
FIG. 1 is a diagram illustrating a circuit configuration of a power supply apparatus in Embodiment 1.

FIG. 1 is a diagram illustrating an example of a circuit configuration of a switching power supply apparatus in Embodiment 1. The switching power supply apparatus illustrated in FIG. 1 includes a voltage conversion unit 20, a boost converter 22, a DC/DC conversion circuit 23, a CPU 27, a power circuit 26, and switch circuits 19 and 21.

(Voltage Conversion Unit, Power Circuit, CPU)

First, description will be made about the voltage conversion unit 20 configured to convert input voltage of the commercial AC power supply 1. The voltage conversion unit 20 includes a voltage transformer 41 and resistors 40 and 42. The voltage transformer 41 is connected to the commercial AC power supply 1 in parallel and has a primary side and a secondary side. Voltage of the commercial AC power supply 1 is input into the primary side, and the voltage transformer 41 is configured to transmit the voltage to the secondary side with a predetermined turns ratio. The secondary side of the voltage transformer 41 includes opposite ends connected respectively to a reference voltage (illustrated as 1.65 V in FIG. 1) and an AD port that is an analog/digital (A/D) port of the CPU 27 as a control unit. The AD port of the CPU 27 receives an AC voltage that is generated on the secondary side the voltage transformer 41 and centered about 1.65 V. The resistor 40 is used for limiting current on the primary side of the voltage transformer 41. The resistor 42 is used for voltage conversion.

The power circuit 26 is, for example, an AC/DC switching converter. The power circuit 26 is configured to convert AC voltage input from the commercial AC power supply 1 into a direct current voltage (illustrated as 3.3 V in FIG. 1) and to supply the converted voltage to the CPU 27. The CPU 27 operates on the direct current voltage that is generated by the power circuit 26 and input into a Vcc 30 terminal of the CPU 27. The CPU 27 is connected to a memory as a storage unit and is configured to control the switching power supply apparatus based on a control program stored in the memory 30. The CPU 27 may include a memory such as a ROM (not illustrated) provided therein and may be configured to store the control program. The CPU 27 further includes a timer for measuring a time built therein. The CPU 27 is capable of detecting the input voltage of the commercial AC power supply 1 from a value acquired by converting into a digital signal an (analog) voltage signal that is input into the AD port from the voltage conversion unit 20. Specifically, the CPU 27 consecutively detects a voltage value from the voltage conversion unit 20, calculates, based on the voltage value, one of an effective value and a peak value of the AC voltage of the commercial AC power supply 1, and estimates the input voltage of the commercial AC power supply 1. The CPU 27 also includes I/O ports 1 and 2, which will be described later in detail.

(Boost Converter)

Next, description will be made about the boost converter 22 that is a first voltage conversion unit configured to boost the input voltage of the commercial AC power supply 1 and output the boosted voltage (first voltage) to the DC/DC conversion circuit 23. The boost converter 22 includes a smoothing and rectifying unit including a diode bridge 2 and a capacitor 3, and additionally includes a control IC 46, a switching element 45, an inductor 47, diodes 48 and 49, capacitors 43 and 52, and resistors 44, 50 and 51. The control IC 46, a first control unit, is driven by voltage supplied through an activation start resistor 44, and the capacitor 43, a first voltage supply unit, is charged with the voltage for driving the control IC 46. The control IC 46 is configured to control switching action of the switching element 45 (illustrated as a MOS-FET in FIG. 1), a first switching unit, according to a voltage that is obtained by dividing an output voltage of the boost converter 22 with the resistors 50 and 51. Hereafter, the switching element 45 will be referred to as a field-effect transistor (FET) 45.

The AC voltage input from the commercial AC power supply 1 is rectified by the diode bridge 2 and smoothed by the capacitor 3. While the control IC 46 keeps the FET 45 in an on-state, the voltage charged in the capacitor 3 is stored in the inductor 47. In contrast, while the control IC 46 keeps the FET 45 in an off-state, the energy (voltage) stored in the inductor 47 is output via the diode 49 to be stored in the capacitor 52 and also output to the DC/DC conversion circuit 23. The diode 48 is connected to the inductor 47 and the diode 49 in parallel, the inductor 47 and the diode 49 being connected to each other in series. This configuration advances activation start of the DC/DC conversion circuit 23 that lies in a subsequent stage of the boost converter 22. That is, the diode 48 includes an anode terminal and a cathode terminal, the anode terminal being connected to an output side of the smoothing and rectifying unit, the cathode terminal being connected to an output side of the boost converter 22. As a result, the diode 48 forms a circuit configuration that bypasses the inductor 47 and the diode 49 so that an output from the smoothing and rectifying unit is directly output to an output end of the boost converter 22.

(DC/DC Conversion Circuit)

Next, description will be made about the DC/DC conversion circuit 23 that is a second voltage conversion unit configured to convert direct current voltage input from the boost converter 22 into a direct current voltage (second voltage) to be supplied to a connected load. The DC/DC conversion circuit 23 includes a transformer 9 including a primary winding 9a, a secondary winding 9b, and an auxiliary winding 9c. The primary winding 9a of the transformer 9 is connected in series to a switching element 5 (illustrated as a MOS-FET in FIG. 1 and hereinafter referred to as a FET 5), a second switching unit. A gate terminal of the FET 5 is connected to an output terminal 37 of an oscillation control circuit 6 that is a second control unit configured to control switching action of the FET 5. The circuit on the auxiliary winding 9c of the transformer 9 includes a diode 7 and a capacitor 8 that form a second voltage supply unit, which is configured to smooth and rectify an output of the auxiliary winding 9c of the transformer 9, so as to supply a direct current voltage V1 to a power source terminal 36 of the oscillation control circuit 6. Between the primary winding 9a of the transformer 9 and the power source terminal 36 of the oscillation control circuit 6, an activation start resistor 4 is connected. A Zener diode 32 is provided such that the voltage V1 input into the power source terminal 36 of the oscillation control circuit 6 does not exceed a predetermined voltage.

The secondary winding 9b of the transformer 9 is connected to a diode 10 and a capacitor 11, which are configured to rectify an output from a secondary side of the transformer 9 to generate a direct current voltage. In addition, the secondary side of the transformer 9 is connected to a feedback circuit that includes resistors 14 and 15, a shunt regulator 12, and a photocoupler 13 and is configured to divide an output voltage of the secondary side of the transformer 9. The shunt regulator 12 is configured to compare a voltage divided by the resistors 14 and 15 with an inside reference voltage and to amplify an error between the divided voltage and the inside reference voltage.

The shunt regulator 12 is connected to a light emitting diode (LED) of the photocoupler 13, and a conduction state of the LED changes according to a conduction state of the shunt regulator 12. According to the conduction state of the LED, a phototransistor of the photocoupler 13 is brought into one of an on-state and an off-state, which is transmitted to a feedback terminal 33 of the oscillation control circuit 6. The oscillation control circuit 6 is configured to control the FET 5 according to a current that flows through the phototransistor of the photocoupler 13. The oscillation control circuit 6 forms a feedback control loop with the feedback circuit, with which the oscillation control circuit 6 can control the output voltage of the secondary side of the transformer 9 to be a target voltage. The oscillation control circuit 6 will be described later in detail.

(Switch Circuit)

A switch circuit 21, a switching unit, includes a switch 24 (illustrated as a relay in FIG. 1) and a switch driver circuit 25. The circuit of the power supply apparatus illustrated in FIG. 1 is configured such that the AC voltage from the commercial AC power supply 1 to be supplied to DC/DC conversion circuit 23 through the boost converter 22 is supplied/cut off by the switch 24. The switch 24 is brought into the on-state by means of the switch driver circuit 25 by setting an output of an I/O port 1 (hereafter, referred to as a port P1) of the CPU 27 at a high (High) level, so that an electricity supply channel from the commercial AC power supply 1 to the boost converter 22 is opened. In contrast, the switch 24 is brought into the off-state by setting the output of the port P1 at a low (Low) level, so that the electricity supply channel from the commercial AC power supply 1 to the boost converter 22 is closed.

A switch circuit 19 is a discharge unit of a capacitor 18 that is connected in parallel to the capacitor 18 of the DC/DC conversion circuit 23 and includes a transistor 28, a photocoupler 31, and resistors 29 and 38. The photocoupler 31 is connected to an ON/OFF terminal 35 of the oscillation control circuit 6 via the resistor 38. The photocoupler 31 includes a secondary side, which is controlled by a control signal from the CPU 27. When an I/O port 2 of the CPU 27 (hereafter, referred to as a port P2) is set at a high level, the transistor 28 is brought into the on-state, so that current flows through a light emitting diode (LED) of the photocoupler 31 via the resistor 29. As a result, a phototransistor of the photocoupler 31 is brought into an on-state, so that a charged voltage of the capacitor 18 can be discharged down to substantially 0 V. In contrast, when the port P2 of the CPU 27 is set at a low level, the transistor 28 is brought into an off-state, so that current does not flow through the LED of the photocoupler 31. As a result, the phototransistor of the photocoupler 31 is also brought into the off-state, charge of the capacitor 18 is started, so that an input voltage V2 of the ON/OFF terminal 35 of the oscillation control circuit 6 increases. When the input voltage V2 exceeds a predetermined voltage, the oscillation control circuit 6 is subjected to activation start, so as to start controlling the DC/DC conversion circuit 23.

[Configuration of Oscillation Control Circuit]

Figure 2:
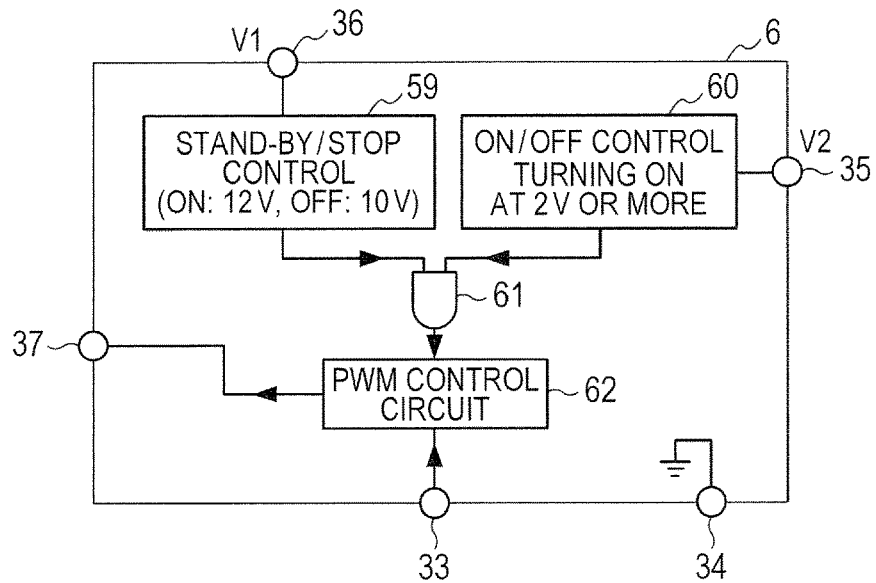
FIG. 2 is a block diagram of an oscillation control circuit in Embodiment 1.

FIG. 2 is a block diagram illustrating a circuit configuration of the oscillation control circuit 6 for controlling the DC/DC conversion circuit 23 illustrated in FIG. 1. As the oscillation control circuit 6, use is normally made of an IC dedicated to power supply control. The oscillation control circuit 6 includes a PWM control circuit 62, an activation/stop control circuit 59, an ON/OFF control circuit 60, and an AND circuit 61. A terminal 34 is a GND (ground) terminal.

The PWM control circuit 62 is configured to determine an on-duty of a drive signal to be output to the FET 5, based on a feedback signal that is transmitted from the secondary side of the transformer 9 and input through the feedback terminal 33. The PWM control circuit 62 is connected to the gate terminal of the FET 5 via the output terminal 37 and configured to output the drive signal having the determined on-duty to the FET 5.

The activation/stop control circuit 59 is connected to the power source terminal 36 and configured to control activation or stop of the oscillation control circuit 6 according to the input voltage V1 input into the power source terminal 36. In the present embodiment, it is assumed that an activation start voltage (fourth voltage) at which the oscillation control circuit 6 starts operating is 12 V, an operation stop voltage at which the oscillation control circuit 6 stops the operation is 10 V. The hysteresis width provided between the activation start voltage and the operation stop voltage is 2 V (=12 V−10 V), and this is small. Specifically, in a case where the input voltage V1 of the power source terminal 36 of the oscillation control circuit 6 exceeds 12 V at a time of the activation of the switching power supply apparatus, the activation/stop control circuit 59 outputs a high-level signal so as to cause the PWM control circuit 62 to operate. In contrast, when the input voltage V1 of the power source terminal 36 falls below 10 V after the activation of the switching power supply apparatus, the activation/stop control circuit 59 outputs a low level signal so as to cause the PWM control circuit 62 to stop operating.

The ON/OFF control circuit 60 is connected to the ON/OFF terminal 35, and the ON/OFF terminal 35 receives a voltage generated across the resistor 17 when a voltage input into the primary winding 9a of the transformer 9 is divided by resistors 16 and 17. When the input voltage V2 of the ON/OFF terminal 35 is 2 V (fifth voltage) or higher, the ON/OFF control circuit 60 outputs a high-level signal so as to cause the PWM control circuit 62 to operate. In contrast, when the input voltage V2 of the ON/OFF terminal 35 is lower than 2 V, the ON/OFF control circuit 60 outputs a low level signal so as to cause the PWM control circuit 62 to stop operating. The AND circuit 61 carries out a logical AND (AND) between the signal output from the ON/OFF control circuit 60 and the activation/stop control circuit 59, and outputs the AND to the PWM control circuit 62. As a result, the PWM control circuit 62 operates so as to control the FET 5 when the ON/OFF control circuit 60 and the activation/stop control circuit 59 both output the high-level signals.

As described above, the ON/OFF terminal 35 of the oscillation control circuit 6 is connected to the phototransistor of the photocoupler 31 through the resistor 38. When a high-level signal is output from the port P2 of the CPU 27, and the transistor 28 of the switch circuit 19 is brought into the on-state, current flow through the light emitting diode of the photocoupler 31, and the phototransistor is brought into the on-state. Then, the voltage charged in the capacitor 18 is discharged down to substantially 0 V. In such a manner, the CPU 27 setting an output signal from the port P2 at the high level decreases the input voltage of the ON/OFF terminal 35 to less than 2 V, with the result that the PWM control circuit 62 of the oscillation control circuit 6 stops operating. This enables immediate stop of the operation of the DC/DC conversion circuit 23. In addition, the CPU 27 outputting a low level signal from the port P2 brings the transistor 28 of the switch circuit 19 into an off-state and also brings the photocoupler 31 into an off-state. This increases a charged voltage of the capacitor 18 and increases the input voltage V2 input into the ON/OFF control circuit 60 through the ON/OFF terminal 35. The input voltage V2 then reaches 2 V (volts) or higher, and the PWM control circuit 62 starts operating. As seen from the above, switching between the on-state and the off-state of the transistor 28 by the CPU 27 can increase the voltage of the ON/OFF control circuit 60 after the voltage of the power source terminal 36 is increased sufficiently, so as to cause the DC/DC conversion circuit 23 to start operating. To stop the operation of the DC/DC conversion circuit 23, bringing the transistor 28 into the on-state can stop the operation immediately.

[Control Sequence of Power Supply Apparatus]

Figure 3:
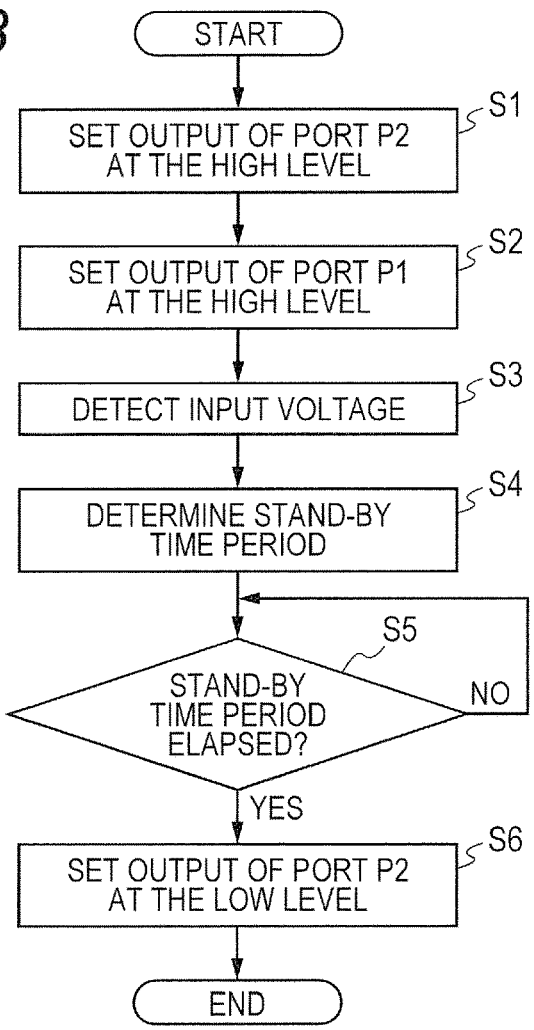
FIG. 3 is a flowchart illustrating a control sequence of the power supply apparatus in Embodiment 1.

FIG. 3 is a flowchart illustrating a control sequence in the activation of the switching power supply apparatus in the present embodiment. When the switching power supply apparatus is brought into the on-state, the CPU 27 is activated so that the CPU 27 executes a process illustrated in FIG. 3 according to a control program stored in the memory 30. In step (hereafter, abbreviated to S) 1, the CPU 27 outputs a high-level signal from the port P2 to decrease the input voltage V2 of the ON/OFF terminal 35 of the oscillation control circuit 6 in the DC/DC conversion circuit 23 to substantially 0 V, stopping the control over the DC/DC conversion circuit 23. In S2, the CPU 27 sets an output of the port P1 at the high level to bring the switch 24 into the on-state, opening the electricity supply channel between the commercial AC power supply 1 and the boost converter 22 to supply an AC voltage to the boost converter 22. In addition, the CPU 27 resets and starts the timer to measure a time from setting the output of the port P1 at the high level.

In S3, the CPU 27 converts a voltage signal (analog signal) received through the AD port into a digital signal, the voltage signal being converted by the voltage conversion unit 20, and detects a voltage value of the AC voltage input from the commercial AC power supply 1 based on the digital signal obtained by the conversion. In S4, based on the input voltage detected in S3, the CPU 27 sets the port P1 at the high level and then sets the port P2 at the low level to determine a stand-by time period taken to subject the oscillation control circuit 6 to activation start.

The stand-by time period from setting the output of the port P1 at the high level to setting the output of the port P2 at the low level is a time period necessary to satisfy the following two conditions. The two conditions include one that the output voltage of the boost converter 22 is stable within a range of a target voltage, and another that the input voltage V1 of the power source terminal 36 of the oscillation control circuit 6 in the DC/DC conversion circuit 23 is sufficiently high. The higher the input voltage from the commercial AC power supply 1, the larger the current flows into the capacitor 43 via the activation start resistor 44 of the boost converter 22, and the charged voltage of the capacitor 43 increases rapidly. As a result, the higher the input voltage of the commercial AC power supply 1, the earlier the control IC 46 of the boost converter 22 can start control operation of the control IC 46. In addition, with an increase in the input voltage of the commercial AC power supply 1, the output voltage of the boost converter 22 comes close to a boosted voltage value, a target for the boost converter 22, and can reach the range of the target voltage in a short time.

In addition, as described above, before the control IC 46 is activated, and the boost converter 22 starts operating, the input voltage of the commercial AC power supply 1 is supplied to the power source terminal 36 of the oscillation control circuit 6 in the DC/DC conversion circuit 23 in the subsequent stage, through the diode 48. In the DC/DC conversion circuit 23, the higher the input voltage of the commercial AC power supply 1, the larger the current flows into the capacitor 8 via the activation start resistor 4, and a charged voltage of the capacitor 8 increases rapidly. This causes the input voltage V1 of the power source terminal 36 of the oscillation control circuit 6 to increase rapidly. Therefore, the oscillation control circuit 6 can start control operation of the oscillation control circuit 6.

As described above, the input voltage from the commercial AC power supply 1 has a close relationship with the stand-by time period taken to subject the oscillation control circuit 6 to activation. Therefore, the stand-by time period from setting the output of the port P1 at the high level to setting the output of the port P2 to the low level can be determined according to the input voltage of the commercial AC power supply 1. In the present embodiment, the input voltage of the commercial AC power supply 1 is associated with the stand-by time period dependent on the input voltage, and a table including information on the association is stored in the memory 30. The CPU 27 determines, based on the AC voltage of the commercial AC power supply 1 detected in S3 and the information included in the table stored in the memory 30, the stand-by time period that is taken to subject the oscillation control circuit 6 to activation and dependent on the AC voltage of the commercial AC power supply 1. In S5, the CPU 27 refers to a timer value of the timer started in S2 and determines whether the stand-by time period has been elapsed. When determining that the stand-by time period has been elapsed, the CPU 27 advances the process to S6. When determining that the stand-by time period has not been elapsed, the CPU 27 returns the process to S5. In S6, the CPU 27 sets the output of the port P2 at the low level. This setting increases the input voltage V2 of the ON/OFF terminal 35 of the oscillation control circuit 6. When the input voltage V2 reaches 2 V, the predetermined voltage, or higher, the oscillation control circuit 6 starts the activation of the DC/DC conversion circuit 23.

[Timing Chart of Start-Up of Power Supply Apparatus]

Figure 4A:
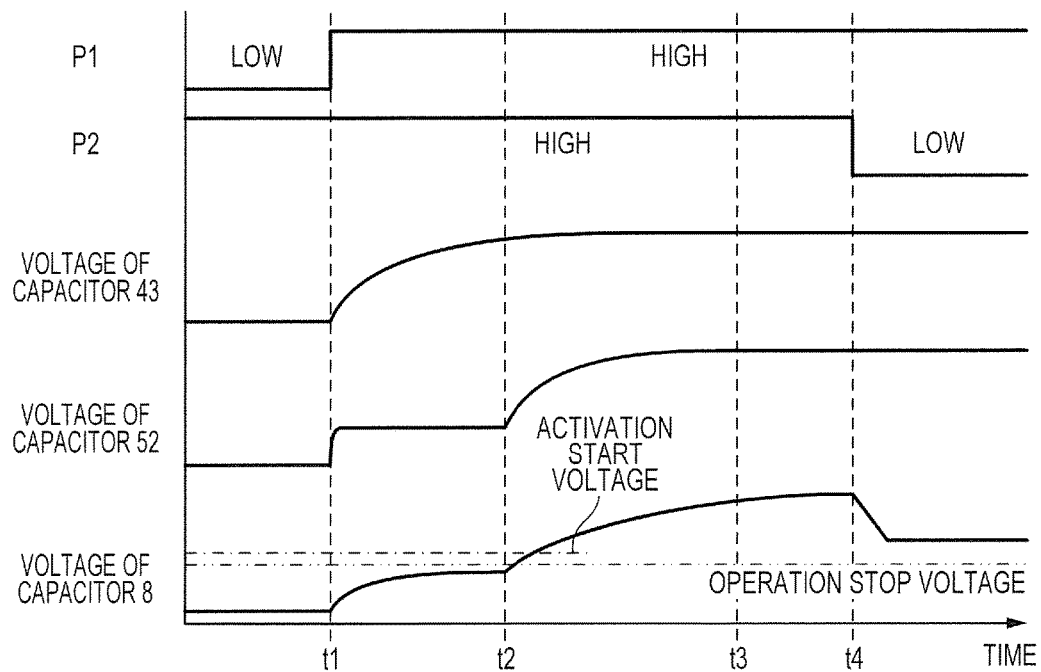
FIG. 4A and FIG. 4B are timing charts of the power supply apparatus in Embodiment 1.
Figure 4B:
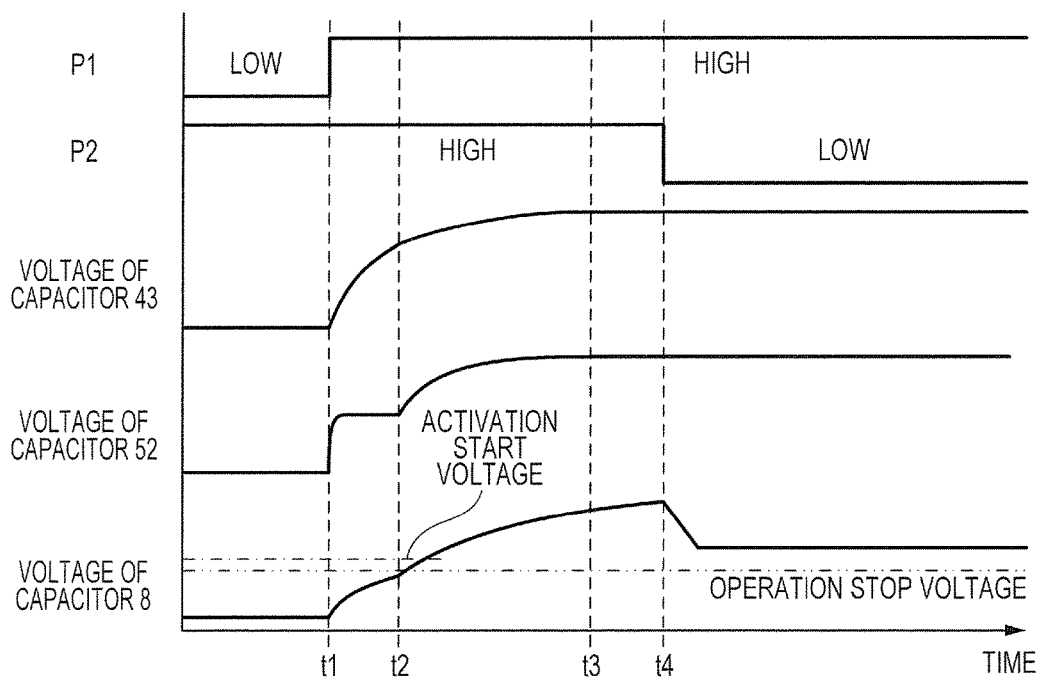

FIG. 4A and FIG. 4B are timing charts that illustrate changes in signals of the ports P1, P2 of the CPU 27 described with reference to FIG. 3, changes in voltages of the capacitors 43 and 52 of the boost converter 22, and changes in a voltage charged into the capacitor 8 of the DC/DC conversion circuit 23. The timing charts illustrated in FIG. 4A and FIG. 4B have the same structure. FIG. 4B is a timing chart illustrating a case where the input voltage of the commercial AC power supply 1 is high as compared with a case of FIG. 4A. FIG. 4A illustrates, from the top to the bottom, states of the signals output from the ports P1, P2 of the CPU 27, and the changes in the voltages charged into the capacitors 43, 52 and 8. The signals output from the ports P1, P2 change between the high level and the low level. For the capacitors 43, 52 and 8, the ordinate represents the voltages of the capacitors. In addition, for the voltage of the capacitor 8, a dash-dot line represents the activation start voltage, and a chain double-dashed line represents the operation stop voltage. The abscissa represents time, and t1, t2, t3 and t4 represent time points (timings). FIG. 4B is similar to FIG. 4A, and how to read this chart will be omitted.

Before the time point t1, the port P1 is set at the low level, and the port P2 is set at the high level, the voltages of the capacitors 43 and 52,8 are substantially at 0 V. At the time point t1, the CPU 27 sets the output of the port P1 at the high level to bring the switch 24 into the on-state, the electricity supply channel from the commercial AC power supply 1 to the boost converter 22 is opened, and AC voltage is supplied to the boost converter 22. This setting causes current to flow via the activation start resistor 44 of the boost converter 22, increasing the voltage of the capacitor 43. Current flows into the capacitor 52 via the diode 48, also increasing the charged voltage of the capacitor 52. At the time point t2, the voltage of the capacitor 43 reaches a predetermined voltage or higher (third voltage or higher), and the control IC 46 starts operating, increasing the output voltage of the boost converter 22, also increasing the voltage of the capacitor 52 further. The voltage of the capacitor 8 starts increasing from at time point t1 by the voltage supplied via the diode 48 of the boost converter 22. At the time point t2, the control IC 46 starts control over the boost converter 22, the voltage of the capacitor 8 further increases with the voltage rise of the capacitor 52.

At time point t3, the voltage of the capacitor 52 reaches the range of the target voltage. Then, at time point t4, at which the voltage of the capacitor 8 has become sufficiently high exceeding the activation start voltage of the oscillation control circuit 6 in the DC/DC conversion circuit 23 (in the time charts, illustrated by the dash-dot lines), the CPU 27 sets the output of the port P2 at the low level. At this point in time, the voltage V1 of the capacitor 8 is input into the power source terminal 36 of the oscillation control circuit 6. The activation/stop control circuit 59 therefore outputs a high-level signal to the AND circuit 61 so as to cause the PWM control circuit 62 to operate. Meanwhile, the input voltage V2 of the ON/OFF terminal 35 connected to the ON/OFF control circuit 60 is substantially at 0 V. The CPU 27 setting the output of the port P2 at the low level brings the transistor 28 of the switch circuit 19 into the off-state, also brings the photocoupler 31 into the off-state, starting the charge of the capacitor 18. This increases the charged voltage of the capacitor 18, increasing the input voltage V2 input into the ON/OFF terminal 35 of the oscillation control circuit 6. The input voltage V2 then reaches 2 V or higher, and a high-level signal is output from the ON/OFF control circuit 60 to the AND circuit 61. The high-level signal causes the PWM control circuit 62 of the oscillation control circuit 6 to start operating and perform switching control over the FET 5. As a result, the DC/DC conversion circuit 23 starts electricity supply to a load. The operation of the oscillation control circuit 6 decreases the voltage V1 charged in the capacitor 8. The capacitor 8, however, holds a voltage higher than the activation start voltage and thus does not stop the operation of the oscillation control circuit 6.

As illustrated in FIG. 3, the CPU 27 determines the time point t4 based on the input voltage of the commercial AC power supply 1 detected via the AD port. FIG. 4B is a timing chart of the case where the input voltage of the commercial AC power supply 1 is high. In FIG. 4B, as compared with FIG. 4A, the voltages of the capacitors increase to respective predetermined voltages early. The DC/DC conversion circuit 23 therefore can be activated earlier than the case of FIG. 4A. By determining the time point t4 based on the detected input voltage of the commercial AC power supply 1, an activation timing for the DC/DC conversion circuit 23 can be determined appropriately according to the input voltage.

In conventional practice, in the DC/DC conversion circuit 23, a stand-by time period is set in conformity with a condition for a case where the input voltage from the commercial AC power supply is low, and the stand-by time period has been set as an operation start timing for the power supply control IC, irrespective of an actual input voltage of the commercial AC power supply 1. For that reason, whether the input voltage of the commercial AC power supply 1 is high or low, the DC/DC conversion circuit 23 is activated only when the stand-by time period is elapsed. In contrast, in the present embodiment, the stand-by time period from bringing the switch 24 into the on-state to start electricity supply from the commercial AC power supply 1, to setting the port P2 at the low level to cause the DC/DC conversion circuit 23 to operate is determined according to the input voltage of the commercial AC power supply 1. In the present embodiment, the boost converter 22 is provided in a previous stage of the DC/DC conversion circuit 23, and even with the boost converter 22 provided, the activation of the switching power supply apparatus can be performed quickly according to the input voltage with stability. The present embodiment is not limited to the configuration of the boost converter 22 and the DC/DC conversion circuit 23 and is applicable to a converter having another scheme.

As described above, according to the present embodiment, the operation start timing for the power supply apparatus can be advanced.

In Embodiment 1, the timing for causing the DC/DC conversion circuit to operate is determined based on the input voltage of the commercial AC power supply. In Embodiment 2, description will be made about an example in which the timing for causing the DC/DC conversion circuit to operate is determined based on a power supply frequency of the commercial AC power supply.

[Configuration of Switching Power Supply Apparatus]

Figure 5:
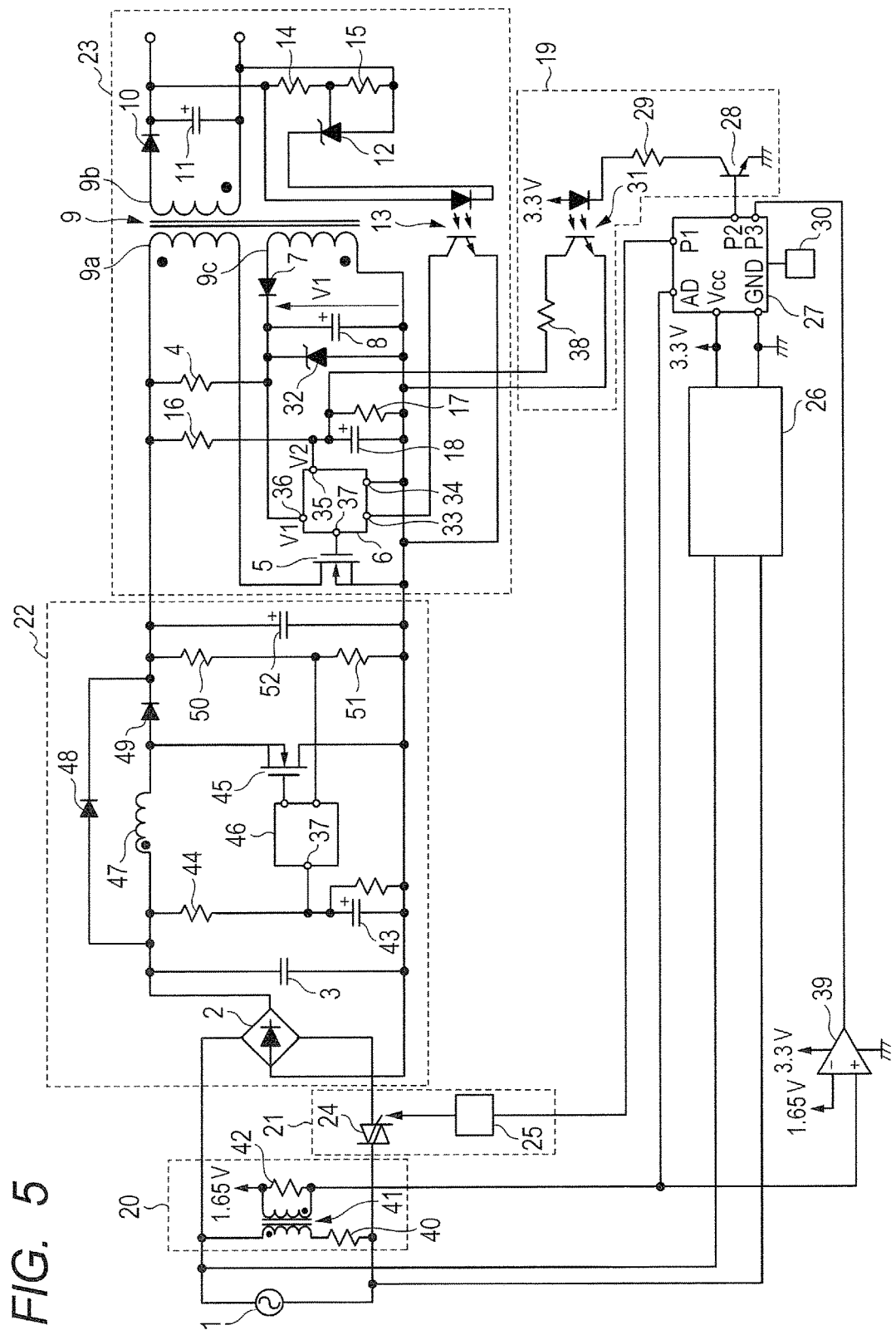
FIG. 5 is a diagram illustrating a circuit configuration of the power supply apparatus in Embodiments 2 and 3.

FIG. 5 is a diagram illustrating a circuit configuration of a switching power supply apparatus in the present embodiment. A difference in circuit configuration between the present embodiment and Embodiment 1 is that the switch 24 in the switch circuit 21 is changed from a relay to a bidirectional thyristor (hereafter, referred to as a triac) and that a comparator 39, which is a frequency detection unit, is provided to detect a power supply frequency. In FIG. 5, the same circuit components as those illustrated in FIG. 1 in Embodiment 1 will be denoted by the same reference numerals and will not be described here.

The comparator 39 includes a noninverting input terminal (+) to which a secondary side output of the voltage transformer 41 is input, and an inverting input terminal (−) to which a reference voltage value (illustrated as 1.65 V in FIG. 5) is input. To the noninverting input terminal, an AC voltage of 0 to 3.3 V centered about 1.65 V is input. The comparator 39 is configured to compare voltages input into the noninverting input terminal and the inverting input terminal. The comparator 39 then outputs the high level when an input voltage of the noninverting input terminal is equal to or higher than the reference voltage value of the inverting input terminal, and outputs the low level when the input voltage of the noninverting input terminal is less than the reference voltage value of the inverting input terminal. The CPU 27 is provided with a port P3 to which an output signal of the comparator 39 is input. The CPU 27 is configured to measure a period of a pulse signal received from the port P3, so as to detect a power supply frequency of the commercial AC power supply 1. That is, the CPU 27 is configured to measure a time period from a rising (or falling) of a pulse signal output from the comparator 39 to a rising (or falling) of the next pulse signal, so as to detect a power supply period of the commercial AC power supply 1. Then, based on the detected power supply period, the CPU 27 can calculate the power supply frequency of the commercial AC power supply.

Next, description will be made about the switch circuit 21 that switches between performing electricity supply and not performing electricity supply from the commercial AC power supply 1 in the present embodiment to the boost converter 22. While a relay is used as the switch 24 of the switch circuit 21 in Embodiment 1, use is made of a triac in the present embodiment. The CPU 27 is configured to perform ON/OFF control over a phototriac coupler included in the switch driver circuit 25 configured to control drive of the triac. Typically, as a phototriac coupler for a switching power supply apparatus, use is often made of a phototriac coupler of a type configured to turn on a triac in synchronization with zero-crossing timings of the AC voltage of the commercial AC power supply 1 so as to suppress a rush current. In the present embodiment, the phototriac coupler included in the switch driver circuit 25 is assumed to be a phototriac coupler of a zero-crossing-timing-synchronous type.

[Control Sequence of Power Supply Apparatus]

Figure 6:
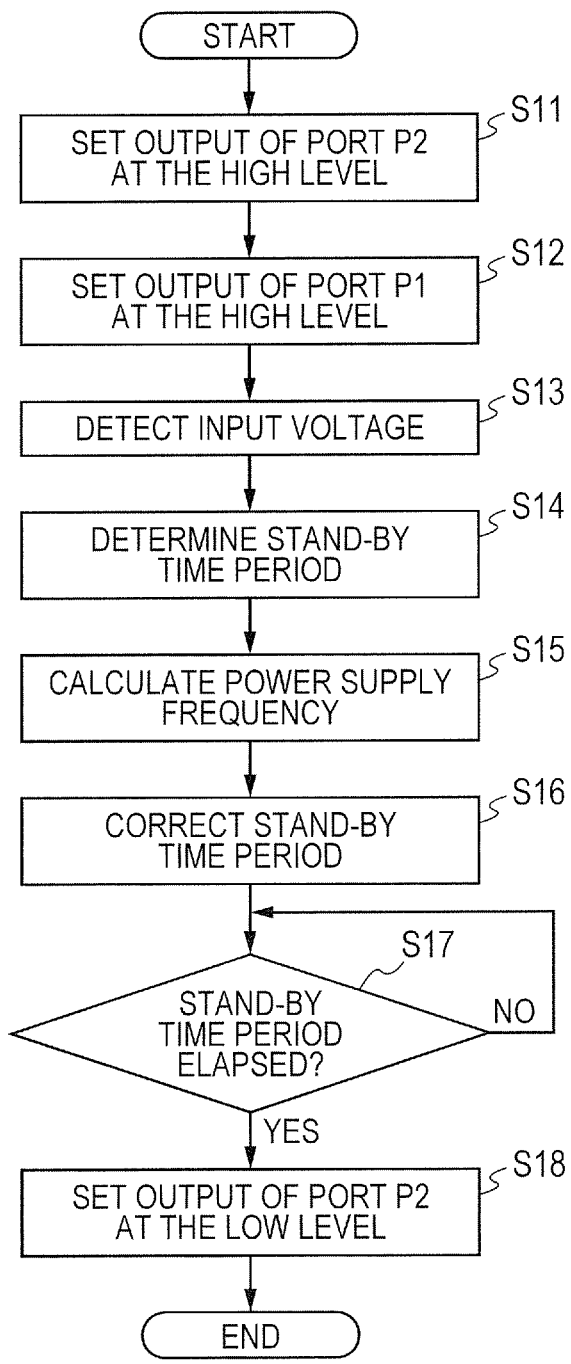
FIG. 6 is a flowchart illustrating a control sequence of the power supply apparatus in Embodiment 2.

FIG. 6 is a flowchart illustrating a control sequence in the activation of the switching power supply apparatus in the present embodiment. When the switching power supply apparatus is brought into the on-state, the CPU 27 is activated so that the CPU 27 executes a process illustrated in FIG. 6 according to a control program stored in the memory 30. The process of S11 to S14 of FIG. 6 is the same as the process of S1 to S4 described with reference to FIG. 3 in Embodiment 1, and thus will not be described here. In S15, the CPU 27 detects a period of a pulse signal that is input from the comparator 39 into the port P3, and calculates the power supply frequency of the commercial AC power supply 1 based on the detected pulse period. In S16, the CPU 27 corrects the stand-by time period determined in S14, according to a difference between the power supply frequency of the commercial AC power supply 1 calculated in S15 and a period of a reference frequency (e.g., 47 Hz (Hertz)). How to correct the stand-by time period will be described later in detail. S17 and S18 are the same as the process of S5 and S6 described with reference to FIG. 3 in Embodiment 1, and thus will not be described here.

[Changing Stand-by Time Period According to Frequency of Commercial AC Power Supply]

Figure 7:
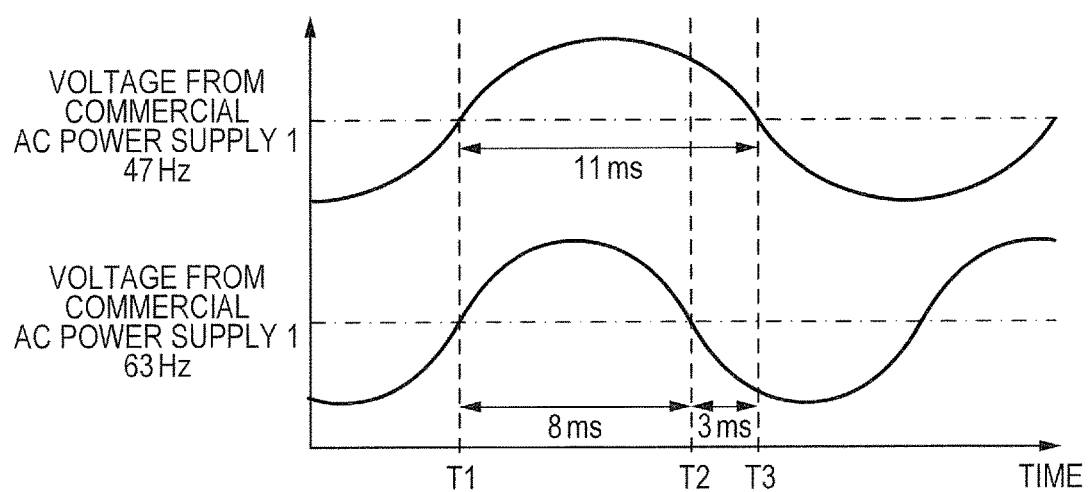
FIG. 7 is a diagram used for describing a frequency difference of a commercial AC power supply in Embodiment 2.

With reference to FIG. 7, description will be made about a correction process for the stand-by time period using a frequency difference of the commercial AC power supply 1 in S16 of FIG. 6. FIG. 7 is a diagram illustrating a voltage waveform of the AC voltage input from the commercial AC power supply 1. In FIG. 7, the voltage waveform on the upper side of the drawing illustrates a voltage waveform of a case where the power supply frequency is 47 Hz (reference frequency), and the voltage waveform on the lower side of the drawing illustrates a voltage waveform of a case where the power supply frequency is 63 Hz. T1 and T3 denote zero-crossing timings of the case where the power supply frequency is 47 Hz, and T1 and T2 denote zero-crossing timings of the case where the power supply frequency is 63 Hz.

In the present embodiment, the switch driver circuit 25 includes a phototriac coupler used therein configured to be turned on in synchronization with zero-crossing timings. Therefore, the switch 24 actually changes switch timings of the electricity supply channel from the commercial AC power supply 1 to the boost converter 22 according to the power supply frequency of the commercial AC power supply 1. For example, assuming that 47 Hz is set to the reference frequency of the commercial AC power supply 1, when the CPU 27 sets the output of the port P1 at the high level after the zero-crossing timing T1, a timing with which the phototriac coupler is turned on is the zero-crossing timing T3. As a result, there may be a delay of about 11 ms (milliseconds) at the maximum from setting the output of the port P1 at the high level until turning on the switch 24. The stand-by time period therefore needs to include a margin of about 11 ms, a half cycle of the reference frequency. Thus, the stand-by time period that is used in the present embodiment and included in a table stored in the memory 30 is set at a stand-by time period that is obtained by adding a delay time of about 11 ms, a half cycle of the reference frequency, to the stand-by time period in Embodiment 1.

In contrast, for example, assuming that the power supply frequency of the commercial AC power supply 1 is set at 63 Hz, when the CPU 27 sets the output of the port P1 at the high level after the zero-crossing timing T1, the phototriac coupler is turned on at the zero-crossing timing T2. As a result, there may be a delay of about 8 ms at the maximum from setting the output of the port P1 at the high level by the CPU 27 until turning on the switch 24. Therefore, if the stand-by time period up to setting the output of the port P2 at the low level is set according to the reference frequency (47 Hz), an unnecessary stand-by time period of about 3 ms (=11 ms−8 ms) occurs. Thus, in the process of S16 of FIG. 6, the CPU 27 corrects the stand-by time period determined in S14 to a time period shorter than the stand-by time period by 3 ms according to a difference between a half cycle of the power supply frequency of the commercial AC power supply 1 calculated in S15 (e.g., 63 Hz) and the half cycle of the reference frequency (e.g., 47 Hz). Contrariwise, in a case where the power supply frequency of the commercial AC power supply 1 calculated in S15 is lower than the reference frequency (e.g., 47 Hz), the CPU 27 may correct the stand-by time period determined in S14 to a time period longer than the stand-by time period by a difference in time calculated between the half cycle of the power supply frequency of the commercial AC power supply 1 and the half cycle of the reference frequency.

As described above, by correcting the stand-by time period from turning on the switch 24 to subjecting the DC/DC conversion circuit 23 to activation according to the power supply frequency of the commercial AC power supply 1, further shortening the activation time period can be implemented. In the present embodiment, the stand-by time period from setting the port P1 at the high level to setting the port P2 at the low level is calculated based on a detection result of the input voltage of the commercial AC power supply 1 and the power supply frequency. For example, in place of detecting the input voltage of the commercial AC power supply 1, calculation is made beforehand about a stand-by time period of a case where an AC voltage having a minimum voltage by specification of the power supply is input from the commercial AC power supply 1 (a predetermined stand-by time period), the AC voltage making the stand-by time period maximum. Then, the predetermined stand-by time period may be corrected according to a difference in time between the half cycle of the power supply frequency of the commercial AC power supply 1 and the half cycle of the reference frequency. As seen from the above, rather than using the detection result of the input voltage of the commercial AC power supply 1, determining the stand-by time period using only a detection result of the power supply frequency also enables the activation time period of the DC/DC conversion circuit 23 to be shortened.

As described above, according to the present embodiment, the operation start timing for the power supply apparatus can be advanced.

In Embodiment 2, description has been made about an example in which the timing for causing the DC/DC conversion circuit to operate is determined based on a power supply frequency of the commercial AC power supply. In Embodiment 3, description will be made about an example in which a timing for causing the DC/DC conversion circuit to operate is determined based on a zero-crossing timing of the AC voltage of the commercial AC power supply 1.

[Configuration of Switching Power Supply Apparatus]

Circuits of a switching power supply apparatus in the present embodiment have the same configurations as the circuits illustrated in FIG. 5 in Embodiment 2. Therefore, the circuits in the present embodiment are supposed to be described with the reference numerals denoting the circuits illustrated in FIG. 5 and will not be described here. In the present embodiment, the CPU 27 is configured to perform edge detection using rising (a change from the low level to the high level) and falling (a change from the high level to the low level) of a pulse signal input into the port P3 from the comparator 39, which is a zero-crossing detection unit. By this edge detection, a zero-crossing timing of the AC voltage input from the commercial AC power supply 1 is detected.

[Control Sequence of Power Supply Apparatus]

Figure 8:
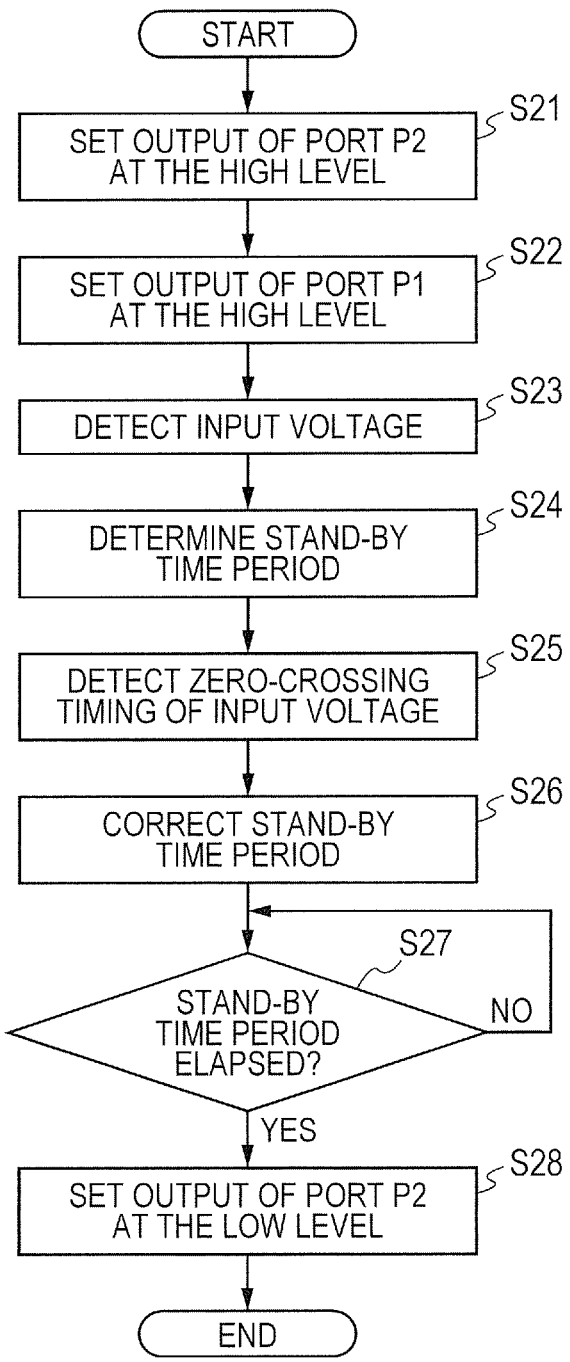
FIG. 8 is a flowchart illustrating a control sequence of the power supply apparatus in Embodiment 3.

FIG. 8 is a flowchart illustrating a control sequence in the activation of the switching power supply apparatus in the present embodiment. When the switching power supply apparatus is brought into the on-state, the CPU 27 is activated, so that the CPU 27 executes a process illustrated in FIG. 8 according to a control program stored in the memory 30. The stand-by time period that is used in the present embodiment and included in a table stored in the memory 30 is set, as in Embodiment 2, at a stand-by time period that is obtained by adding the delay time equivalent to the half cycle of the reference frequency, to the stand-by time period in Embodiment 1.

The process of S21 to S24 in FIG. 8 are the same as the process of S1 to S4 described with reference to FIG. 3 in Embodiment 1, and thus will not be described here. In S22, the CPU 27 resets and starts the timer to measure a time from setting the output of the port P1 at the high level. In S25, the CPU 27 detects a zero-crossing timing of the AC voltage input from the commercial AC power supply 1. That is, after starting the timer in S22, the CPU 27 detects a first edge of a pulse signal (falling from the high level to the low level or rising from the low level to the high level) that is input into the port P3 of the CPU 27 from the comparator 39. Then, the CPU 27 reads a timer value at a time of detecting the first edge of the pulse signal. In S26, CPU 27 corrects the stand-by time period by subtracting the timer value read in S25 from the stand-by time period determined in S24. The process of S27 and S28 is the same as the process of S5 and S6 described with reference to FIG. 3 in Embodiment 1, and thus will not be described here.

In the present embodiment, the switch driver circuit 25 for controlling the triac of the switch 24 includes a phototriac coupler used therein configured to be turned on in synchronization with zero-crossing timings. Therefore, a state of the switch 24 is actually switched according to a difference in time between a timing with which the CPU 27 sets the output of the port P1 at the high level and a zero-crossing timing, and a time point (timing) at which the AC voltage from the commercial AC power supply 1 is supplied to the boost converter is changed. For example, in a case where the output of the port P1 is set at the high level immediately after a zero-crossing timing or immediately before the next zero-crossing timing, a state of the triac of the switch 24 is switched at the same timing, the next zero-crossing timing. However, a time period from a timing for setting the output of the port P1 at the high level to switching the state of the triac of the switch 24 includes a difference in time equivalent to by a half wave (a half cycle) of the power supply frequency of the commercial AC power supply 1, at the maximum. For example, when the power supply frequency of the commercial AC power supply 1 is 50 Hz, one period of the power supply frequency is 20 ms, and a difference in time of about 10 ms, a time period equivalent to a half cycle occurs, at the maximum. Therefore, by correcting the stand-by time period from setting the output of the port P1 at the high level to causing the DC/DC conversion circuit 23 to operate, according to a difference in time from a zero-crossing timing of the AC voltage of the commercial AC power supply 1, further shortening of the activation time period can be implemented.

The comparator 39 used the present embodiment for detecting the zero-crossing timing can detect the power supply frequency of the commercial AC power supply 1 as described in Embodiment 2. Thus, in addition to the correction process in S25 and S26 of FIG. 8 for the stand-by time period that is based on the detected zero-crossing timing, the correction process in S15 and S16 of FIG. 6 in Embodiment 2 for the stand-by time period that is based on the detected power supply frequency is performed. This combined correction process enables the correction of the stand-by time period to be performed with higher precision.

In the present embodiment, the stand-by time period from setting the port P1 at the high level to setting the port P2 at the low level is calculated based on a detection result of the input voltage of the commercial AC power supply 1 and the zero-crossing timing of the AC voltage of the commercial AC power supply 1. For example, in place of detecting the input voltage of the commercial AC power supply 1, calculation is made beforehand about a stand-by time period of a case where an AC voltage having a minimum voltage by specification of the power supply is input from the commercial AC power supply 1 (a predetermined stand-by time period), the AC voltage making the stand-by time period maximum. Then, a time period from setting the port P1 at the high level to detecting a first zero-crossing timing since may be measured, and the predetermined stand-by time period may be corrected by subtracting the measured time period from the predetermined stand-by time period. As seen from the above, rather than using the detection result of the input voltage of the commercial AC power supply 1, determining the stand-by time period based only on the time period setting the port P1 at the high level to detecting the first zero-crossing timing also enables the activation time period of the DC/DC conversion circuit 23 to be shortened.

As described above, according to the present embodiment, the operation start timing for the power supply apparatus can be advanced.

The switching power supply apparatus described in Embodiments 1 to 3 are applicable to, for example, a low-voltage power supply for an image forming apparatus, that is, a power supply for supplying electric power to a controller (control unit) and a driving unit for motors or the like. Hereafter, description will be made about a configuration of an image forming apparatus to which the switching power supply apparatuses in Embodiments 1 to 3 are applicable.

[Configuration of Image Forming Apparatus]

Figure 9:
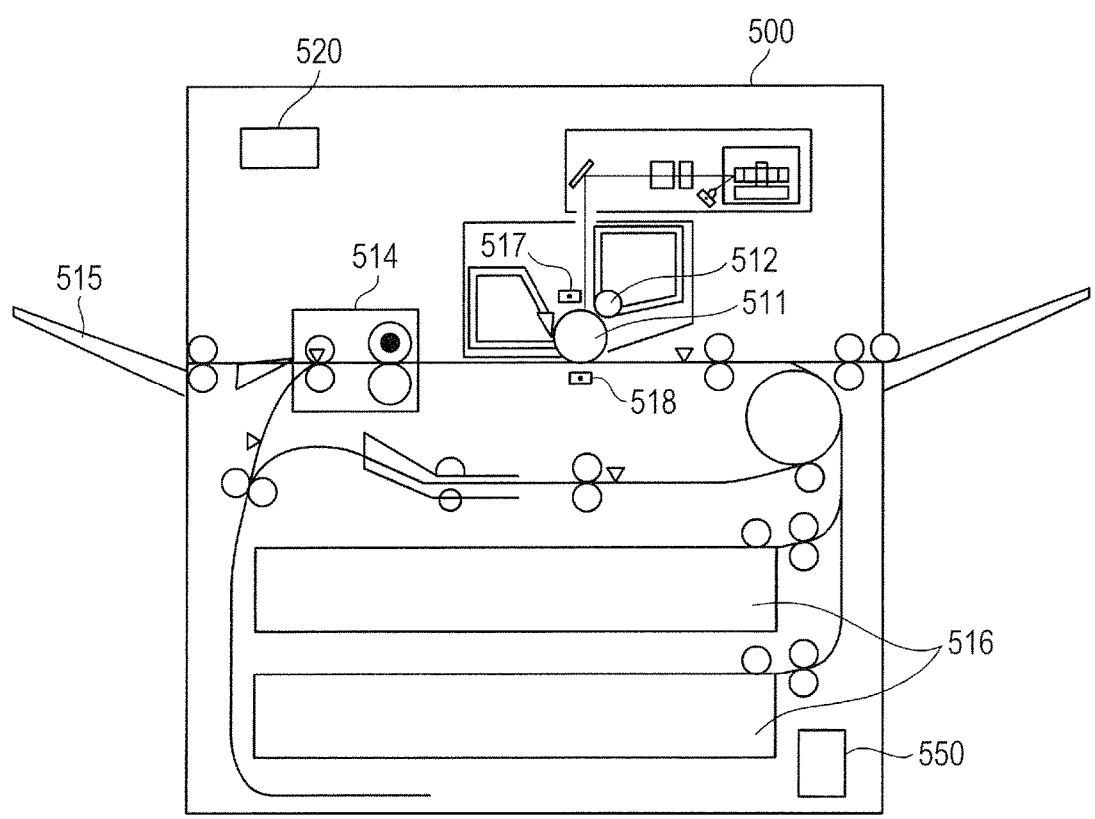
FIG. 9 is a schematic diagram an image forming apparatus in Embodiment 4.

As an example of the image forming apparatus, a laser beam printer will be described. FIG. 9 illustrates a schematic configuration of the laser beam printer as an example of an electrophotographic printer. A laser beam printer 500 includes a photosensitive drum 511 as an image bearing member on which an electrostatic latent image is formed, a charge unit 517 (charge unit) configured to charge the photosensitive drum 511 uniformly, and a developing unit 512 (developing unit) configured to develop the electrostatic latent image formed on the photosensitive drum 511 with toner. A transfer unit 518 (transfer unit) transfers a toner image developed on the photosensitive drum 511 onto a sheet as a recording material (not illustrated) supplied from a cassette 516, a fuser 514 fuses the toner image transferred onto the sheet, which is ejected to a tray 515. These photosensitive drum 511, charge unit 517, developing unit 512, and transfer unit 518 make up an image forming unit. In addition, the laser beam printer 500 includes a switching power supply apparatus 550 that is described in Embodiments 1 to 3. It should be noted that the image forming apparatus to which the switching power supply apparatus 550 described in Embodiments 1 to 3 is applicable is not limited to one illustrated in FIG. 9 and may be, for example, an image forming apparatus including a plurality of image forming units. Moreover, such an image forming apparatus may be an image forming apparatus that includes a primary transfer unit configured to transfer a toner image on the photosensitive drum 511 onto an intermediate transfer belt, and a secondary transfer unit configured to transfer the toner image on the intermediate transfer belt onto a sheet.

The laser beam printer 500 includes a controller 520 configured to control operation of forming an image performed by the image forming unit and operation of conveying a sheet. The switching power supply apparatus 550 described in Embodiments 1 to 3 is configured to supply electric power to, for example, the controller 520. The switching power supply apparatus 550 described in Embodiments 1 to 3 is configured to supply electric power to a driving unit for motors or the like to rotate the photosensitive drum 511 or to drive various rollers to convey sheet. The switching power supply apparatus 550 advances a timing for starting operation of the switching power supply apparatus 550 according to the input voltage of the commercial AC power supply, the laser beam printer 500 can quickly shift to a stand-by state after a power switch is turned on, the stand-by state being a state in which the laser beam printer 500 is available, so that the usability of the laser beam printer 500 can be improved. In Embodiments 1 to 3, the CPU 27 of the switching power supply apparatus 550 performs control over the switch circuits 19 and 21, detection of voltage from the voltage conversion unit 20, and the like. However, such things may be performed by, for example, the controller 520 of the laser beam printer 500 as an image forming apparatus.

As described above, according to the present embodiment, the operation start timing for the power supply apparatus can be advanced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-224656, filed Nov. 18, 2016, which is hereby incorporated by reference herein in its entirety.

What is claimed is:

1. A power supply apparatus comprising:
    a voltage detection unit configured to detect an input voltage input from an alternating current power supply;
    a first voltage conversion unit configured to convert the input voltage into a first voltage;
    a second voltage conversion unit connected to the first voltage conversion unit and configured to convert the first voltage output from the first voltage conversion unit into a second voltage different from the first voltage;
    a switch unit configured to connect the alternating current power supply to the first voltage conversion unit or disconnect the alternating current power supply from the first voltage conversion unit; and
    a control unit configured to control the switch unit and the second voltage conversion unit,
    wherein the control unit determines a stand-by time period from making a connection of the switch unit to subjecting the second voltage conversion unit to activation start according to the input voltage detected by the voltage detection unit.

2. The power supply apparatus according to claim 1, wherein the control unit determines the stand-by time period so that the stand-by time period is made shorter as the input voltage detected by the voltage detection unit increases.

3. The power supply apparatus according to claim 1, wherein the first voltage conversion unit includes:
    a smoothing and rectifying unit configured to rectify and smooth an AC voltage;
    an inductor configured to accumulate a direct current voltage output from the smoothing and rectifying unit in the inductor and to output the direct current voltage to the second voltage conversion unit;
    a first switching unit configured to switch outputting of the direct current voltage from the inductor to the second voltage conversion unit; a first control unit configured to control a switching operation of the first switching unit according to the voltage output to the second voltage conversion unit; and
    a first voltage supply unit configured to accumulate a direct current voltage output from the smoothing and rectifying unit in the first voltage supply unit and to supply the direct current voltage output from the smoothing and rectifying unit in the first voltage supply unit to the first control unit, and
    the first control unit is activated when the voltage accumulated in the first voltage supply unit reaches a third voltage or higher.

4. The power supply apparatus according to claim 3, wherein the first voltage conversion unit includes a diode that is connected to the inductor in parallel, and
    the diode includes an anode terminal and a cathode terminal, the anode terminal being connected to an output side of the smoothing and rectifying unit, the cathode terminal being connected to an output side of the first voltage conversion unit.

5. The power supply apparatus according to claim 4, wherein the second voltage conversion unit includes:
    a transformer that includes a primary winding, a secondary winding, and an auxiliary winding;
    a second switching unit configured to switch a current flowing through the primary winding of the transformer;
    a second control unit configured to control a switching operation of the second switching unit;

a second voltage supply unit configured to rectify and smooth a voltage output from the auxiliary winding and supply the rectified and smoothed voltage to the second control unit; and a resistor configured to supply a voltage obtained by dividing a voltage input into the primary winding to the second control unit, and the second control unit starts the switching operation of the second switching unit when the voltage supplied from the second voltage supply unit reaches a fourth voltage or higher, and the voltage supplied through the resistor reaches a fifth voltage or higher.

6. The power supply apparatus according to claim 5, wherein the second voltage conversion unit includes: a capacitor that is connected to the resistor in parallel; a discharge unit that is connected to the capacitor in parallel and configured to discharge a voltage charged in the capacitor, and the control unit subjects the discharge unit to activation to discharge the voltage charged in the capacitor before controlling the switch unit so as to make a connection between the alternating current power supply and the first voltage conversion unit.

7. The power supply apparatus according to claim 6, further comprising a storage unit that stores information on association between the input voltage and a stand-by time period from a time point at which the control unit controls the switch unit so as to connect the alternating current power supply and the first voltage conversion unit to a time point at which a voltage the second voltage supply unit of the second voltage conversion unit reaches the fourth voltage, wherein the control unit stops activation of the discharge unit when the stand-by time period elapses, the stand-by time period corresponding to the input voltage detected by the voltage detection unit acquired by the storage unit.

8. The power supply apparatus according to claim 7, wherein the stand-by time period stored in the storage unit is made shorter as the input voltage increases.

9. The power supply apparatus according to claim 8, wherein the switch unit is a relay.

10. The power supply apparatus according to claim 8, wherein the switch unit is a bidirectional thyristor.

11. The power supply apparatus according to claim 10, further comprising:

a frequency detection unit configured to detect a power supply frequency of the alternating current power supply, wherein the control unit corrects the stand-by time period acquired from the storage unit based on a difference in time between a time period equivalent to a half cycle of the power supply frequency of the alternating current power supply detected by the frequency detection unit and a time period equivalent to a half cycle of a reference frequency of the alternating current power supply.

12. The power supply apparatus according to claim 11, wherein the control unit subtracts the difference in time from the stand-by time period when the detected power supply frequency of the alternating current power supply is higher than the reference frequency, and corrects the stand-by time period by adding the difference in time to the stand-by time period when the detected power supply frequency of the alternating current power supply is lower than the reference frequency.

13. The power supply apparatus according to claim 10, further comprising:

a zero-crossing detection unit configured to detect a zero-crossing timing of the AC voltage of the alternating current power supply, wherein the control unit corrects the stand-by time period by subtracting, from the stand-by time period acquired from the storage unit, a time period from a time point at which the control unit controls the switch unit so as to connect the alternating current power supply and the first voltage conversion unit to a time point at which the zero-crossing detection unit detects a first zero-crossing timing.

14. The power supply apparatus according to claim 11, wherein the stand-by time period acquired the storage unit includes a delay time from a time point at which the control unit controls the switch unit to a time point at which the alternating current power supply is connected to the first voltage conversion unit.

15. The power supply apparatus according to claim 14, wherein the delay time is a time period equivalent to a half cycle of the reference frequency.

16. An image forming apparatus comprising:

an image forming unit configured to form an image on a recording material; and a power supply apparatus configured to supply electric power to the image forming unit, wherein the power supply apparatus includes:

a voltage detection unit configured to detect an input voltage input from an alternating current power supply;

a first voltage conversion unit configured to convert the input voltage into a first voltage;

a second voltage conversion unit that is connected to the first voltage conversion unit and configured to convert the first voltage output from the first voltage conversion unit into a second voltage different from the first voltage;

a switch unit configured to connect the alternating current power supply to the first voltage conversion unit or disconnect the alternating current power supply from the first voltage conversion unit; and a control unit configured to control the switch unit and the second voltage conversion unit, wherein the control unit determines a stand-by time period from making a connection of the switch unit to subjecting the second voltage conversion unit to activation start according to the input voltage detected by the voltage detection unit.

17. The image forming apparatus according to claim 16, wherein the control unit determines the stand-by time period so that the stand-by time period is made shorter as the input voltage detected by the voltage detection unit increases.

18. The power supply apparatus according to claim 1, wherein said first voltage conversion unit is a boost converter to increase the input voltage to a higher first voltage higher than the input voltage, and said voltage conversion unit is a step-down converter to decrease the higher first voltage to a lower first voltage lower than the higher first voltage.

19. The image forming apparatus according to claim 17, further comprising a controller configured to control the image forming apparatus and a drive unit configured to drive the image forming apparatus, wherein the power supply apparatus supplies voltages to the controller and the drive unit.

* * * * *